US011984301B2

(12) United States Patent
Taira et al.

(10) Patent No.: US 11,984,301 B2
(45) Date of Patent: May 14, 2024

(54) EDGE RING, SUBSTRATE SUPPORT, SUBSTRATE PROCESSING APPARATUS AND METHOD

(71) Applicant: TOKYO ELECTRON LIMITED, Tokyo (JP)

(72) Inventors: Takashi Taira, Miyagi (JP); Takaaki Kikuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 197 days.

(21) Appl. No.: 16/941,976

(22) Filed: Jul. 29, 2020

(65) Prior Publication Data

US 2021/0035783 A1 Feb. 4, 2021

(30) Foreign Application Priority Data

Aug. 2, 2019 (JP) ................................. 2019-143057

(51) Int. Cl.
*H01J 37/32* (2006.01)
*H01L 21/67* (2006.01)
*H01L 21/687* (2006.01)

(52) U.S. Cl.
CPC .. *H01J 37/32642* (2013.01); *H01J 37/32715* (2013.01); *H01L 21/68735* (2013.01); *H01J 37/32082* (2013.01); *H01L 21/67069* (2013.01)

(58) Field of Classification Search
CPC ........... H01J 37/32642; H01J 37/32715; H01J 37/32082; H01L 21/68735; H01L 21/67069; H01L 21/3065; H01L 21/6831; H01L 21/6833; H01L 21/68742; B23Q 3/15; H02N 13/00

USPC .......... 156/345.14, 345.23, 345.51
See application file for complete search history.

(56) References Cited

U.S. PATENT DOCUMENTS

| 6,709,547 B1* | 3/2004 | Ni ..................... H01L 21/67069 |
| | | 156/915 |
| 9,349,618 B2 | 5/2016 | Yamawaku et al. |
| 10,090,161 B2* | 10/2018 | Doba ............... H01J 37/32651 |
| 2008/0236749 A1* | 10/2008 | Koshimizu ....... H01J 37/32449 |
| | | 156/345.33 |
| 2009/0151870 A1* | 6/2009 | Urakawa ........... H01J 37/32642 |
| | | 156/345.1 |
| 2013/0008609 A1* | 1/2013 | Koshimizu ....... H01J 37/32155 |
| | | 156/345.51 |

(Continued)

FOREIGN PATENT DOCUMENTS

| JP | 2012-146743 A | 8/2012 |
| JP | 2018-160666 A | 10/2018 |

(Continued)

OTHER PUBLICATIONS

English Machine Translation of Huh et al. (KR20080075734A) retrieved from ESPACNET on Nov. 1, 2022 (Year: 2022).*

*Primary Examiner* — Ram N Kackar
*Assistant Examiner* — Laureen Chan
(74) *Attorney, Agent, or Firm* — XSENSUS LLP

(57) ABSTRACT

An edge ring includes a first edge ring, and a second edge ring that has a side surface adjacent to a side surface of the first edge ring and is movable in a vertical direction along the side surface of the first edge ring. Further, the side surface of the first edge ring and the side surface of the second edge ring at least partially face each other in a movement range of the second edge ring.

17 Claims, 5 Drawing Sheets

(56) References Cited

U.S. PATENT DOCUMENTS

| | | | |
|---|---|---|---|
| 2014/0017900 A1* | 1/2014 | Doba | H01J 37/32091 |
| | | | 156/345.28 |
| 2017/0213758 A1* | 7/2017 | Rice | H01L 21/6831 |
| 2018/0358211 A1* | 12/2018 | Mun | H01L 21/6831 |
| 2019/0362948 A1* | 11/2019 | Sarode Vishwanath | |
| | | | H01L 21/3065 |
| 2020/0234928 A1* | 7/2020 | Vishwanath | H01L 21/68742 |
| 2020/0234981 A1* | 7/2020 | Schmid | H01L 21/67063 |
| 2020/0328105 A1* | 10/2020 | Sun | H01L 21/67069 |
| 2020/0395195 A1* | 12/2020 | Sanchez | H01J 37/32715 |

FOREIGN PATENT DOCUMENTS

| | | | | |
|---|---|---|---|---|
| JP | 2019-71369 A | | 5/2019 | |
| KR | 2008075734 A | * | 8/2008 | |
| WO | WO-2020231611 A1 | * | 11/2020 | H01J 37/20 |

* cited by examiner

FIG.2A
(RELATED ART)

(COMPARATIVE EXAMPLE)

| POSITION OF EDGE RING | |
|---|---|
| 0.0 mm | LIFT UP |

FIG.2B (PRESENT EMBODIMENT)

| POSITION OF EDGE RING | |
|---|---|
| 0.0 mm | LIFT UP |

H2 > H1

(COMPARATIVE EXAMPLE)

(PRESENT EMBODIMENT)

EDGE RING, SUBSTRATE SUPPORT, SUBSTRATE PROCESSING APPARATUS AND METHOD

CROSS-REFERENCE TO RELATED APPLICATIONS

This application claims priority to Japanese Patent Application No. 2019-143057, filed on Aug. 2, 2019, the entire contents of which are incorporated herein by reference.

TECHNICAL FIELD

The present disclosure relates to an edge ring, a substrate support, a substrate processing apparatus, and a substrate processing method.

BACKGROUND

A technique in which a part of an edge ring (also referred to as "focus ring") disposed to surround a substrate is driven to move up and down has been proposed. For example, Japanese Patent Application Publication No. 2012-146743 discloses a technique in which a focus ring is divided into an inner focus ring and an outer focus ring, and the inner focus ring or the outer focus ring is lifted by a pusher pin, which promotes decomposition and removal of deposits attached onto the lifted focus ring by plasma.

The edge ring is consumed by being exposed to the plasma. When the edge ring is consumed, heights of a sheath formed above the edge ring and a sheath formed above the substrate become different from each other and ions are obliquely incident on an edge region of the substrate. Thus, the verticality of the etching shape in the edge region of the substrate is lost and, thus the processing characteristics of the edge region of the substrate are changed. For example, Japanese Patent Application Publication No. 2018-160666 discloses that a part of the edge ring is driven to move up and down in response to the consumption of the edge ring to eliminate the height difference of the sheath.

The present disclosure provides an edge ring that includes a plurality of members and is capable of suppressing variation in process characteristics occurring when one member is vertically moved up and down with respect to the other members, a substrate support, a substrate processing apparatus, and a substrate processing method.

SUMMARY

In accordance with an aspect of the present disclosure, there is provided an edge ring including: a first edge ring; and a second edge ring that has a side surface adjacent to a side surface of the first edge ring and is movable in a vertical direction along the side surface of the first edge ring. Further, the side surface of the first edge ring and the side surface of the second edge ring at least partially face each other in a movement range of the second edge ring.

BRIEF DESCRIPTION OF THE DRAWINGS

The objects and features of the present disclosure will become apparent from the following description of embodiments, given in conjunction with the accompanying drawings, in which:

FIGS. 2A and 2B show an RF path of an edge ring according to the embodiment and a comparative example;

DETAILED DESCRIPTION

Figure 1:
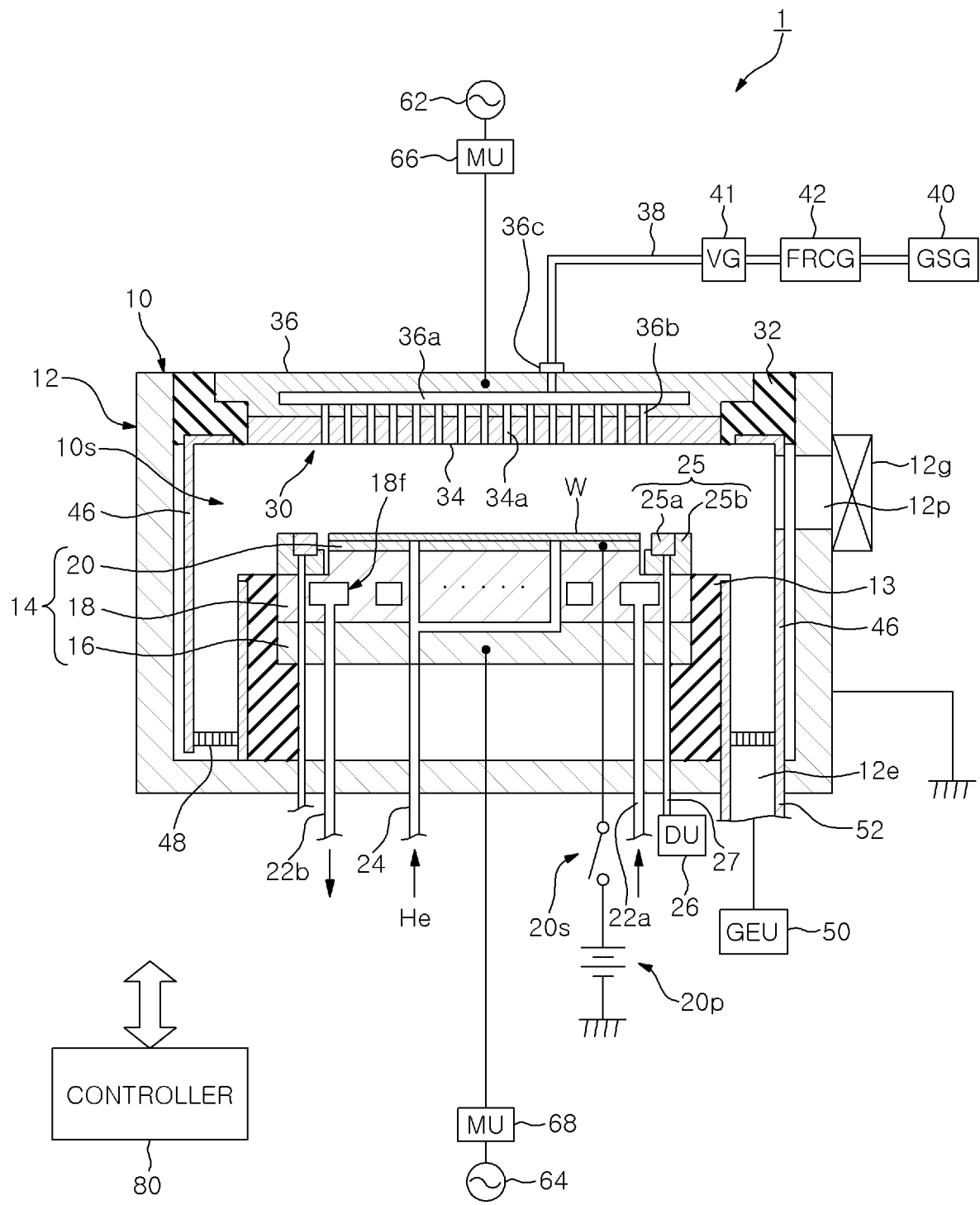
FIG. 1 is a cross-sectional view schematically showing an example of a substrate processing apparatus according to an embodiment.

Hereinafter, embodiments of the present disclosure will be described in detail with reference to the accompanying drawings. Like reference numerals will be given to like or corresponding parts throughout the drawings and redundant description thereof will be omitted.

<Substrate Processing Apparatus>

A substrate processing apparatus 1 according to an embodiment will be described with reference to FIG. 1. FIG. 1 is a cross-sectional view schematically showing an example of a substrate processing apparatus 1 according to the embodiment.

The substrate processing apparatus 1 includes a chamber 10. The chamber 10 has an inner space 10s therein. The chamber 10 includes a chamber body 12. The chamber body 12 has a substantially cylindrical shape. The chamber body 12 is made of, e.g., aluminum. A corrosion resistant film is coated on an inner wall surface of the chamber body 12. The corrosion resistant film may be, e.g., a ceramic film made of aluminum oxide or yttrium oxide.

A passage 12p is formed in a sidewall of the chamber body 12. A substrate W is transferred between the inner space 10s and the outside of the chamber 10 through the passage 12p. The passage 12p can be opened and closed by a gate valve 12g. The gate valve 12g is disposed along the sidewall of the chamber body 12.

A supporting part 13 is disposed on a bottom portion of the chamber body 12. The supporting part 13 is made of an insulating material. The supporting part 13 has a substantially cylindrical shape. The supporting part 13 extends upward from the bottom portion of the chamber body 12 in the inner space 10s. The supporting part 13 supports a substrate support 14 at an upper portion thereof. The substrate support 14 is configured to support the substrate W in the inner space 10s.

The substrate support 14 includes a lower electrode 18 and an electrostatic chuck 20. The substrate support 14 may further include an electrode plate 16. The electrode plate 16 is made of a conductor such as aluminum and has a substantially disc shape. The lower electrode 18 is provided on the electrode plate 16. The lower electrode 18 is made of a conductor such as aluminum and has a substantially disc shape. The lower electrode 18 is electrically connected to the electrode plate 16.

The electrostatic chuck 20 is disposed on the lower electrode 18. The substrate W is placed on a top surface of the electrostatic chuck 20. The electrostatic chuck 20 has a main body and an electrode. The main body of the electrostatic chuck 20 has a substantially disc shape and is made of a dielectric material. The electrode of the electrostatic chuck 20 has a film shape and is disposed in the main body of the electrostatic chuck 20. The electrode of the electrostatic chuck 20 is connected to a DC power supply 20p through a switch 20s. When a voltage is applied from the DC power supply 20p to the electrodes of the electrostatic chuck 20, an electrostatic attractive force is generated between the electrostatic chuck 20 and the substrate W. Due to the generated electrostatic attractive force, the substrate W is attracted to and held on the electrostatic chuck 20.

An edge ring 25 is arranged on a peripheral portion of the lower electrode 18 to surround the edge of the substrate W. The edge ring 25 is provided to improve the in-plane uniformity of plasma processing performed on the substrate W. The edge ring 25 is divided into an inner edge ring 25a and an outer edge ring 25b. The inner edge ring 25a is generally disposed inside or on an inner peripheral side of the outer edge ring 25b. A top surface of the outer edge ring 25b is higher than a top surface of the inner edge ring 25a placed on a mounting surface.

A flow path 18f is formed in the lower electrode 18. A heat exchange medium (e.g., coolant) is supplied from a chiller unit (not shown) disposed outside the chamber 10 through a line 22a. The heat exchange medium supplied to the flow path 18f is returned to the chiller unit through a line 22b. In the substrate processing apparatus 1, a temperature of the substrate W placed on the electrostatic chuck 20 is adjusted by heat exchange between the heat exchange medium and the lower electrode 18.

The substrate processing apparatus 1 further includes a gas supply line 24. The gas supply line 24 is configured to supply a heat transfer gas (e.g., He gas) from a heat transfer gas supply mechanism between the top surface of the electrostatic chuck 20 and the backside of the substrate W.

The substrate processing apparatus 1 further includes an upper electrode 30. The upper electrode 30 is disposed above the substrate support 14. The upper electrode 30 is supported at an upper portion of the chamber body 12 through a member 32. The member 32 is made of an insulating material. The upper electrode 30 and the member 32 block an upper opening of the chamber body 12.

The upper electrode 30 may include a ceiling plate 34 and a holder 36. A bottom surface of the ceiling plate 34 face the inner space 10s and defines the inner space 10s. The ceiling plate 34 may be formed of a semiconductor or a low-resistance conductor with low Joule heat. The ceiling plate 34 has a plurality of gas injection holes 34a that are formed through the ceiling plate 34 in a thickness direction of the ceiling plate 34.

The holder 36 detachably holds the ceiling plate 34. The holder 36 is made of a conductive material such as aluminum. A gas diffusion space 36a is formed inside the holder 36. The holder 36 has a plurality of gas holes 36b that extend downward from the gas diffusion space 36a. The gas holes 36b communicate with the gas injection holes 34a, respectively. A gas inlet port 36c is formed in the holder 36. The gas inlet port 36c is connected to the gas diffusion chamber 36a. A gas supply line 38 is connected to the gas inlet port 36c.

A valve group (VG) 41, a flow rate controller group (FRCG) 42, and a gas source group (GSG) 40 are connected to the gas supply line 38. The gas source group 40, the valve group 41, and the flow rate controller group 42 constitute a gas supply unit. The gas source group 40 includes a plurality of gas sources. The valve group 41 includes a plurality of on/off valves. The flow rate controller group 42 includes a plurality of flow rate controllers. Each of the flow rate controllers of the flow rate controller group 42 is a mass flow controller or a pressure control type flow rate controller. Each of the gas sources of the gas source group 40 is connected to the gas supply line 38 through the corresponding on/off valve of the valve group 41 and the corresponding flow controller of the flow rate controller group 42.

In the substrate processing apparatus 1, a shield 46 is detachably disposed along the inner wall surface of the chamber body 12. The shield 46 is also disposed on an outer periphery of the supporting part 13. The shield 46 prevents reaction by-products from being adhered to the chamber body 12. The shield 46 is obtained by forming a corrosion resistance film on a surface of an aluminum base, for example. The corrosion resistant film may be a ceramic film made of, e.g., yttrium oxide.

A baffle plate 48 is disposed between the supporting part 13 and the sidewall of the chamber body 12. The baffle plate 48 is obtained by forming a corrosion resistant film (a film made of yttrium oxide or the like) on a surface of an aluminum base, for example. The baffle plate 48 has a plurality of through-holes. At the bottom portion of the chamber body 12, a gas exhaust port 12e is disposed below the baffle plate 48. A gas exhaust unit (GEU) 50 is connected to the gas exhaust port 12e through a gas exhaust line 52. The gas exhaust unit 50 includes a pressure control valve and a vacuum pump such as a turbo molecular pump.

The substrate processing apparatus 1 further includes a first radio frequency power supply 62 and a second radio frequency power supply 64. The first radio frequency power supply 62 generates a first radio frequency (RF) power. The first RF power has a frequency suitable for plasma generation. The frequency of the first RF power is within a range of, e.g., 27 MHz to 100 MHz. The first radio frequency power supply 62 is connected to the upper electrode 30 through a matching unit (MU) 66. The matching unit 66 has a circuit for matching an output impedance of the first radio frequency power supply 62 and an impedance of a load side (the upper electrode 30 side). The first radio frequency power supply 62 may be connected to the lower electrode 18 through the matching unit 66. The first radio frequency power supply 62 constitutes an example of a plasma generation unit.

The second radio frequency power supply 64 generates a second radio frequency (RF) power. The second RF power has a frequency lower than the frequency of the first RF power. When the second RF power is used together with the first RF power, the second RF power is used as a bias RF power for attracting ions to the substrate W. The frequency of the second RF power is within a range of, e.g., 400 kHz to 13.56 MHz. The second radio frequency power supply 64 is connected to the lower electrode 18 through a matching unit (MU) 68 and the electrode plate 16. The matching unit 68 has a circuit for matching an output impedance of the second radio frequency power supply 64 and an impedance of a load side (the lower electrode 18 side).

The plasma may be generated by using the second RF power without using the first high-frequency power. In other words, the plasma may be generated by using only a single RF power. In this case, the frequency of the second RF power may be higher than 13.56 MHz, e.g., 40 MHz. Further, in this case, the substrate processing apparatus 1 may not include the first radio frequency power supply 62 and the matching unit 66, and the second radio frequency power supply 64 constitutes an example of a plasma generation unit.

In the substrate processing apparatus 1, a gas is supplied from the gas supply unit and injected into the inner space 10s to generate plasma. Further, by supplying the first RF power and/or the second RF power, a high frequency electric field is generated between the upper electrode 30 and the lower electrode 18, and thus the plasma is generated.

The substrate processing apparatus 1 may further include a controller 80. The controller 80 may be a computer including a processor, a storage unit such as a memory, an input device, a display device, a signal input/output interface, and the like. The controller 80 controls the respective components of the substrate processing apparatus 1. The controller 80 allows an operator to input a command or the like using the input device to manage the substrate processing apparatus 1. Further, the controller 80 allows the display device to visualize and display an operating status of the substrate processing apparatus 1. Further, a control program and recipe data are stored in the storage unit of the controller 80. The control program is executed by the processor of the controller 80 to execute various processes in the substrate processing apparatus 1. The processor executes the control program and controls the respective components of the substrate processing apparatus 1 based on the recipe data.

<Edge Ring>

Figure 3A:
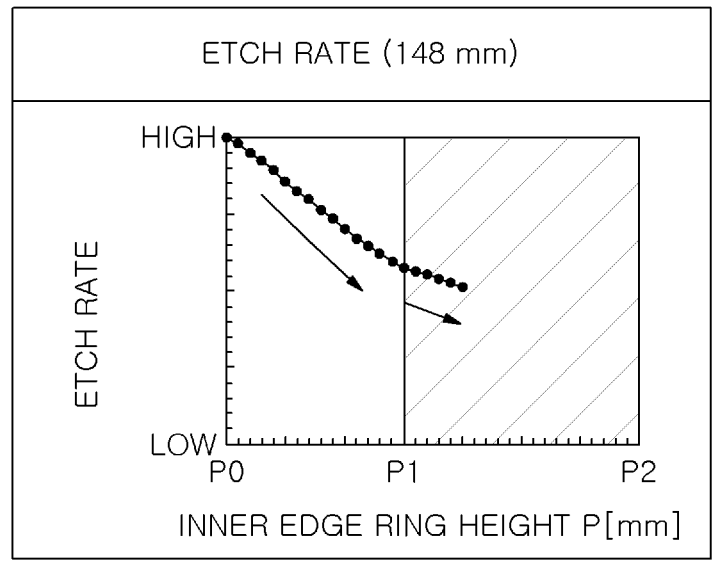
FIGS. 3A and 3B show correlation information between a height of an inner edge ring and an etch rate according to the embodiment and the comparative example.
Figure 3B:
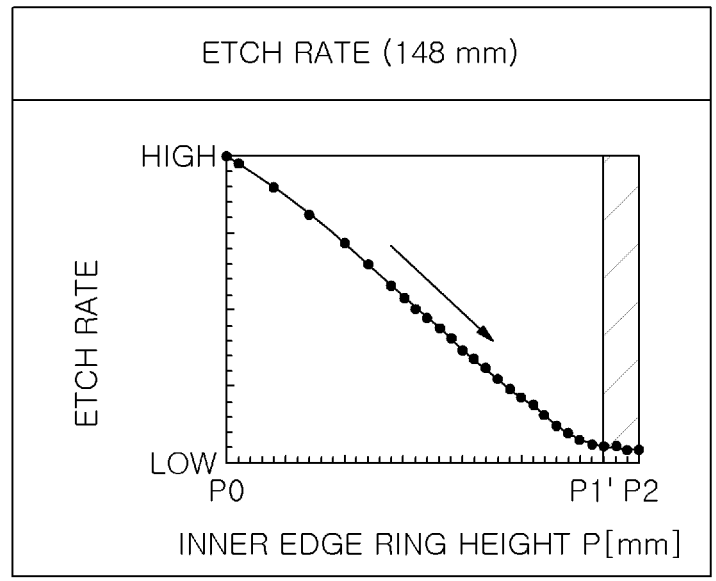

Next, a structure of the edge ring and an etch rate will be described with reference to FIGS. 2A to 3B. FIG. 2A shows a vertical movement of an edge ring 125 and a radio frequency path (RF path) according to a comparative example. FIG. 2B shows a vertical movement and an RF path of the edge ring 25 according to the embodiment. FIG. 3A shows correlation information between a height of an inner edge ring 125a and an etch rate according to the comparative example. FIG. 3B shows correlation information between a height of the inner edge ring 25a and an etch rate according to the embodiment.

The edge ring 125 according to the comparative example shown in FIG. 2A includes the inner edge ring 125a and an outer edge ring 125b. The inner edge ring 125a and the outer edge ring 125b are annular members. The inner edge ring 125a is arranged adjacent to the outer edge ring 125b. The outer edge ring 125b is fixed onto a mounting surface of the lower electrode 18. The outer edge ring 125b has a recess on an inner peripheral side thereof, and a bottom of the recess is a mounting surface 125b2 on which the inner edge ring 125a is placed. The inner edge ring 125a is placed on the mounting surface 125b2 of the recess provided on the inner peripheral side of the outer edge ring 125b. In this state, a side surface 125a1 of the inner edge ring 125a and a side surface 125b1 of the outer edge ring 125b face each other.

A through-hole is formed at the bottom of the recess and extends through the outer edge ring 125b. A lift pin 27 is inserted into the through-hole and the lift pin 27 is driven to move up and down. Thus, the inner edge ring 125a is separated from the mounting surface 125b2 of the outer edge ring 125b and is moved vertically.

The edge ring 25 according to the embodiment shown in FIG. 2B has the inner edge ring 25a and an outer edge ring 25b. The inner edge ring 25a and the outer edge ring 25b are annular members. The materials of the inner edge ring 25a and the outer edge ring 25b may be any material other than a dielectric material such as quartz or alumina having a high resistance. For example, the materials of the inner edge ring 25a and the outer edge ring 25b can be formed of a conductor or a semiconductor such as silicon or silicon carbide. The inner edge ring 25a and the outer edge ring 25b may be made of the same material or different materials.

The inner edge ring 25a has a side surface adjacent to a side surface of the outer edge ring 25b. The outer edge ring 25b is fixed onto the mounting surface of the lower electrode 18. The outer edge ring 25b is an example of a fixed first edge ring.

The outer edge ring 25b has a mounting portion 25b4 for placing the inner edge ring 25a on an inner peripheral side of the side surface 25b1. In the edge ring 25 according to the embodiment, the mounting portion 25b4 forms a recess. The inner edge ring 25a is placed on a top surface 25b2 of the mounting portion 25b4, i.e., on a bottom of the recess. The side surface 25b1 of the outer edge ring 25b and the side surface 25a1 of the inner edge ring 25a at least partially face each other in a vertical movement range of the inner edge ring 25a. The inner edge ring 25a is positioned on the top surface 25b2 of the mounting portion 25b4 at the lowest position. In this state, the side surface 25a1 of the inner edge ring 25a and the side surface 25b1 of the outer edge ring 25b entirely face each other.

A through-hole is formed at the bottom of the recess and extends through the outer edge ring 25b. A lift pin 27 is inserted into the through-hole and the lift pin 27 is driven to move up and down by a drive unit (DU) 26 connected to the lift pin 27 (see FIG. 1). Accordingly, the inner edge ring 25a is pushed up or down by the lift pin 27 and is moved in the vertical direction. The inner edge ring 25a has a side surface adjacent to the side surface of the first edge ring. The inner edge ring 25a is an example of a second edge ring that is vertically movable along the side surface of the first edge ring.

FIGS. 2A and 2B respectively show states before and after the inner edge ring 125a and the inner edge ring 25a are moved in the vertical direction. The left side of FIG. 2A shows a state in which the inner edge ring 125a is placed on the mounting surface 125b2, and the left side of FIG. 2B shows a state in which the inner edge ring 25a is placed on a mounting surface (the top surface of the mounting portion 25b4) 25b2.

A thickness Q2 from a bottom surface of the outer edge ring 25b to the mounting surface 25b2 in FIG. 2B is the same as a thickness Q1 from a bottom surface of the outer edge ring 125b to the mounting surface 125b2 in FIG. 2A. That is, Q2 is equal to Q1 (Q2=Q1). A thickness H2 from the bottom surface to a top surface 25b3 of the outer edge ring 25b in FIG. 2B is greater than a thickness H1 from the bottom surface to a top surface 125b3 of the outer edge ring 125b in FIG. 2A. That is, H2 is greater than H1 (H2>H1). The outer edge ring 125b and the outer edge ring 25b have the same shape except for the thicknesses H1 and H2. Further, the inner edge ring 125a and the inner edge ring 25a have the same shape.

In a comparative example shown in FIG. 2A, a top surface 125a3 of the inner edge ring 125a placed on the mounting surface 125b2 and the top surface 125b3 of the outer edge ring 125b have the same height. On the other hand, due to H2>H1, a top surface 25a3 of the inner edge ring 25a placed on the mounting surface 25b2 in the present embodiment shown in FIG. 2B is lower than the top surface 25b3 of the outer edge ring 25b.

The right side of FIG. 2A shows a state in which the inner edge ring 125a is lifted from the mounting surface 125b2 up to a height P, and the right side of FIG. 2B shows a state in which the inner edge ring 25a is lifted from the mounting surface 25b2 up to the same height P as in FIG. 2A.

Further, the control of the edge region of the substrate is significant for controlling the processing characteristics such as ensuring the in-plane uniformity of the etch rate. The control of the edge region of the substrate with respect to a driving amount of the inner edge ring 125a of the comparative example and the control of the edge region of the substrate with respect to a driving amount of the inner edge ring 25a of the present embodiment will be described in detail hereinafter. The edge region is a region of several mm to 10 mm from the edge of the substrate toward the center of the substrate.

An etch rate at a position of 148 mm from the center of the substrate on the edge region (300 mm wafer) was measured by moving the inner edge ring 125a and the inner edge ring 25a in the vertical direction. FIGS. 3A and 3B show graphs showing an example of a measurement result.

FIG. 3A shows the height P of the inner edge ring 125a on the horizontal axis where P0 indicates the state in which the inner edge ring 125a of the comparative example is placed on the mounting surface 125b2 and also shows an etch rate in the edge region of the substrate on the vertical axis when the height P is changed.

FIG. 3B shows the height P of the inner edge ring 25a on the horizontal axis where P0 indicates the state in which the inner edge ring 25a of the present embodiment is placed on the top surface 25b2 and also shows an etch rate in the edge region of the substrate on the vertical axis when the height P is changed. The etch rate on the vertical axis decreases as it goes downward (low) and increases as it goes up (high).

As a result, in the edge ring 125 of the comparative example, the etch rate according to the rise of the inner edge ring 125a is changed with a constant slope as the height P of the inner edge ring 125a is increased from the height P0 to the height P1. The slope of the etch rate according to the rise of the inner edge ring 125a is changed when the height P of the inner edge ring 125a becomes the height P1 or higher. As such, when there is a singular point where the slope of the etch rate changes in a driving range of the inner edge ring 125a in the vertical direction, a range (a hatched portion in FIG. 3A) in which the correlation between a control amount of the inner edge ring 125a and the etch rate changes occurs as compared to a range before the singular point. In this case, in the movement range (driving range) of the inner edge ring 125a, the control of the processing characteristics of the edge region of the substrate according to the height of the inner edge ring 125a becomes complicated.

Further, the singular point in the comparative example occurs at a position where a bottom surface of the inner edge ring 125a reaches the top surface 125b3 of the outer edge ring 125b, as shown in the right side of FIG. 2A. In other words, the singular point in the comparative example occurs at a position where the side surface 125a1 of the inner edge ring 125a does not face the side surface 125b1 of the outer edge ring 125b.

When the inner edge ring 125a is raised from the mounting surface 125b2, the side surface 125a1 of the inner edge ring 125a and the side surface 125b1 of the outer edge ring 125b at least partially face each other until the inner edge ring 125a reaches a certain height. In this circumstance, potential difference is rarely generated between the side surface 125a1 of the inner edge ring 125a and the side surface 125b1 of the outer edge ring 125b. However, as shown in the example of FIG. 3A, when the inner edge ring 125a shown in FIG. 2A reaches the height between P1 and P2, the side surface 125a1 of the inner edge ring 125a and the side surface 125b1 of the outer edge ring 125b no longer face each other. In this case, the height P1 becomes the singular point, and the singular point serves as the boundary that the potential difference between the side surface 125a1 of the inner edge ring 125a and the side surface 125b1 of the outer edge ring 125b is increased. This makes it difficult to ensure an RF path between the side surface 125b1 of the outer edge ring 125b and the side surface 125a1 of the inner edge ring 125a.

In the case of DC voltage, if there is a gap between the inner edge ring 125a and the outer edge ring 125b, the resistance value becomes high, and no current flows through this gap. However, in the comparative example and the present embodiment, the radio frequency current applied from the second radio frequency power supply 64 to the lower electrode 18 flows through the edge ring 125 and the edge ring 25. In this case, if the side surface 125a1 of the inner edge ring 125a and the side surface 125b1 of the outer edge ring 125b closely face each other, the gap in the vacuum space functions as a capacitor. Thus, the inner edge ring 125a and the outer edge ring 125b located on both sides of the gap D (see FIG. 2B) have substantially the same potential.

It is found that the RF path can be ensured if the side surface 125a1 of the inner edge ring 125a and the side surface 125b1 of the outer edge ring 125b at least partially face each other in the movement range of the inner edge ring 125a.

On the other hand, when the side surface 125a1 of the inner edge ring 125a and the side surface 125b1 of the outer edge ring 125b do not face each other, the potential difference between the side surface 125a1 of the inner edge ring 125a and the side surface 125b1 of the outer edge ring 125b is increased.

A singular point is set when a facing state where there is a facing surface between the side surface 125a1 of the inner edge ring 125a and the side surface 125b1 of the outer edge ring 125b is changed to a non-facing state where there is no facing surface between the side surface 125a1 of the inner edge ring 125a and the side surface 125b1 of the outer edge ring 125b, and the correlation of the processing characteristics of the edge region of the substrate with respect to the movement amount of the inner edge ring 125a is changed before and after the singular point. As a result, the adjustment range of the edge region of the substrate varies before and after the singular point with respect to the control of the height of the edge ring 125, and the control of the edge region of the substrate with respect to the movement amount of the inner edge ring 125a becomes complicated. Thus, the accuracy of controlling the edge region of the substrate is reduced.

On the other hand, in the edge ring 25 according to the present embodiment, the edge ring 25 is configured such that the side surface 25a1 of the inner edge ring 25a and the side surface 25b1 of the outer edge ring 25b at least partially face each other within a range in which the inner edge ring 25a is movable in the vertical direction. In other words, the top surface 25b3 of the outer edge ring 25b extends upward higher than the top surface 25a3 of the inner edge ring 25a such that the height of the top surface 25b3 of the outer edge ring 25b is higher than the height of the top surface 25a3 of the inner edge ring 25a placed on the top surface 25b2.

Accordingly, even when the inner edge ring 25a is controlled to the uppermost position in the driving range thereof, the side surface 25a1 of the inner edge ring 25a and the side surface 25b1 of the outer edge ring 25b at least partially face each other. As a result, as shown in FIG. 2B, even with any height position of the inner edge ring 25a including the uppermost position, the RF path is ensured between the side surface 25a1 of the inner edge ring 25a and the side surface 25b1 of the outer edge ring 25b. Thus, the inner edge ring 25a and the outer edge ring 25b can be electrically connected at any height position of the inner edge ring 25a including the uppermost position.

Accordingly, as shown in FIG. 3B, the etching rate can be linearly changed when the height P of the inner edge ring 25a changes from the height P0 at which the inner edge ring 25a is placed on the mounting surface 25b2 to the height P1' that is the same as the height of the top surface 25b3. As a result, the control amount of the inner edge ring 25*a* and the etch rate are uniformly proportional within the vertical movement range of the inner edge ring 25*a*, so that the processing characteristics of the edge region of the substrate can be easily and accurately controlled.

Further, the gap D between the side surface 25*a*1 of the inner edge ring 25*a* and the side surface 25*b*1 of the outer edge ring 25*b* shown in FIG. 2B may be set to have a distance that can ensure a radio frequency path of the frequency used in the substrate processing apparatus.

In the above-described embodiment, the side surfaces 25*a*1 and 25*b*1 of the inner edge ring 25*a* and the outer edge ring 25*b* have been described as an example of the adjacent surfaces between the inner edge ring 25*a* and the outer edge ring 25*b*. However, the present disclosure is not limited thereto. Hereinafter, modified examples of the adjacent surfaces between the inner edge ring 25*a* and the outer edge ring 25*b* other than the side surfaces 25*a*1 and 25*b*1 will be described with reference to FIGS. 4A to 4F.

<Modification>

FIGS. 4A to 4F show examples of the edge ring 25 according to the modified examples of the embodiment. In a first modified example shown in FIG. 4A, the edge ring 25 according to the first modified example is divided into two edge rings, i.e., an inner edge ring 25*a* and an outer edge ring 25*b*. The inner edge ring 25*a* is disposed on an inner peripheral side of the outer edge ring 25*b*, and a top surface 25*b*3 of the outer edge ring 25*b* is higher than a top surface 25*a*3 of the inner edge ring 25*a*. The difference from the present embodiment shown in FIG. 2B is that the outer edge ring 25*b* of the first modified example does not have a recess for mounting the inner edge ring 25*a*, and the top surface 25*b*2 on which the inner edge ring 25*a* is mounted is entirely flat. In the edge ring 25 according to the first modified example, a side surface 25*a*1 of the inner edge ring 25*a* and a side surface 25*b*1 of the outer edge ring 25*b* at least partially face each other in the vertical movement range of the inner edge ring 25*a*.

Figure 4A:
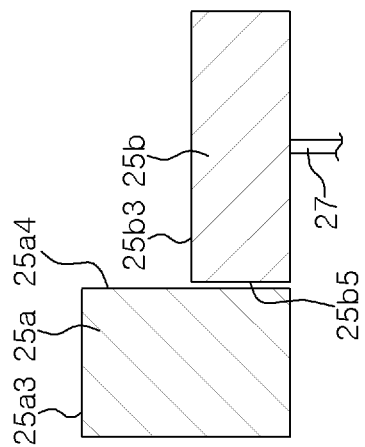
FIGS. 4A to 4F show examples of the edge ring according to modified examples of the embodiment.
Figure 4B:
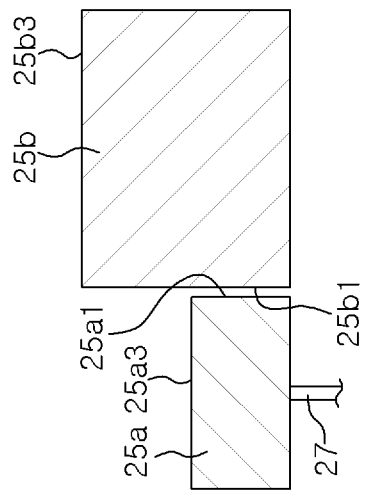

In a second modified example shown in FIG. 4B, the edge ring 25 according to the second modified example is divided into two edge rings, i.e., an inner edge ring 25*a* and an outer edge ring 25*b*. The inner edge ring 25*a* is disposed inside the outer edge ring 25*b*, and a top surface 25*b*3 of the outer edge ring 25*b* is higher than a top surface 25*a*3 of the inner edge ring 25*a*. The difference from the present embodiment shown in FIG. 2B is that the outer edge ring 25*b* does not have a mounting surface for mounting the inner edge ring 25*a*, and the inner edge ring 25*a* is mounted on the lower electrode 18. In the edge ring 25 according to the second modified example, a side surface 25*a*1 of the inner edge ring 25*a* and a side surface 25*b*1 of the outer edge ring 25*b* at least partially face each other in the vertical movement range of the inner edge ring 25*a*.

Further, in the first and second modified examples, the outer edge ring 25*b* is an example of the first edge ring. The inner edge ring 25*a* has the side surface that closely faces the side surface of the first edge ring, and the inner edge ring 25*a* is an example of the second edge ring that is vertically movable along the side surface of the first edge ring.

Figure 4C:
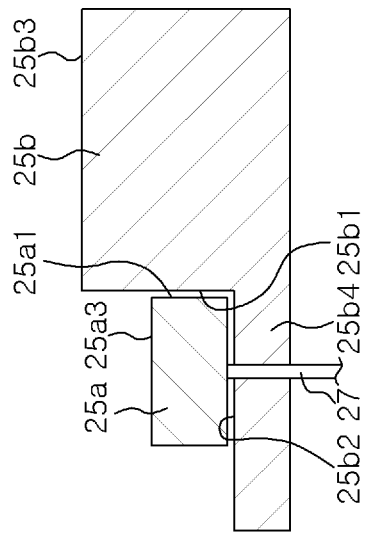

In a third modified example shown in FIG. 4C, the edge ring 25 according to the third modified example is divided into an inner edge ring 25*a* and an outer edge ring 25*b*. The inner edge ring 25*a* is disposed inside the outer edge ring 25*b*, and a top surface 25*a*3 of the inner edge ring 25*a* is higher than a top surface 25*b*3 of the outer edge ring 25*b*. The difference from the second modified example is that the inner edge ring 25*a* is fixed and the outer edge ring 25*b* is driven to move up and down. As such, the edge ring to be driven to move up and down may be disposed outside the fixed edge ring as long as the RF path can be ensured. In the edge ring 25 according to the third modified example, a side surface 25*b*5 of the outer edge ring 25*b* and a side surface 25*a*4 of the inner edge ring 25*a* at least partially face each other in the vertical movement range of the outer edge ring 25*b*.

Further, in the third modified example, the outer edge ring 25*b* is an example of the second edge ring that is vertically movable, and the inner edge ring 25*a* is an example of the first edge ring that is fixed in proximity to the second edge ring.

Figure 4D:
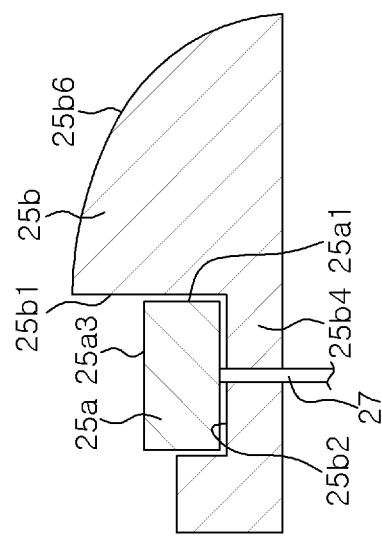

In a fourth modified example shown in FIG. 4D, the edge ring 25 according to the fourth modified example is divided into three edge rings, i.e., an inner edge ring 25*a*, an outer edge ring 25*b*, and an innermost edge ring 25*c*. The inner edge ring 25*a* is disposed on an inner peripheral side of the outer edge ring 25*b*, and a top surface 25*b*3 of the outer edge ring 25*b* is higher than a top surface 25*a*3 of the inner edge ring 25*a*. The difference from the present embodiment shown in FIG. 2B is that the outer edge ring 25*b* is separated from the innermost edge ring 25*c* at and along a side surface 25*b*1 adjacent to the inner edge ring 25*a*. In the structure of the fourth modified example, the inner edge ring 25*a* is mounted on a mounting surface 25*c*2 formed on the innermost edge ring 25*c*. In the edge ring 25 according to the fourth modified example, a side surface 25*a*1 of the inner edge ring 25*a* and the side surface 25*b*1 of the outer edge ring 25*b* at least partially face each other in the vertical movement range of the inner edge ring 25*a*.

Figure 4E:
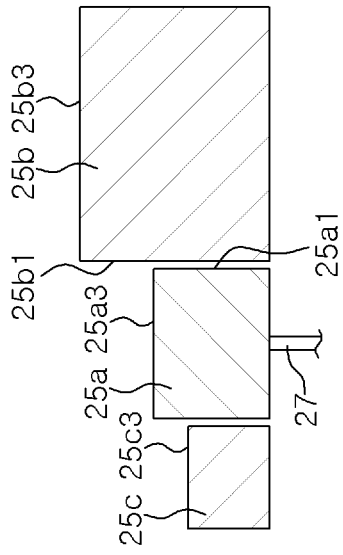

In a fifth modified example shown in FIG. 4E, the edge ring 25 according to the fifth modified example is divided into three edge rings, i.e., an inner edge ring 25*a*, an outer edge ring 25*b*, and an innermost edge ring 25*c*. The inner edge ring 25*a* is disposed inside the outer edge ring 25*b*, and a top surface 25*b*3 of the outer edge ring 25*b* is higher than a top surface 25*a*3 of the inner edge ring 25*a*. The difference from the fourth modified example is that the innermost edge ring 25*c* is disposed inside an inner peripheral surface of the inner edge ring 25*a*, and the inner edge ring 25*a* is mounted on the mounting surface of the lower electrode 18. Further, in the fifth modified example, the top surface 25*b*3 of the outer edge ring 25*b* is higher than the top surface 25*a*3 of the inner edge ring 25*a*. However, the edge ring 25 may have a structure in which a top surface 25*c*3 of the innermost edge ring 25*c* is higher than the top surface 25*a*3 of the inner edge ring 25*a* or the top surface 25*b*3 of the outer edge ring 25*b* and the top surface 25*c*3 of the innermost edge ring 25*c* may be higher than the top surface 25*a*3 of the inner edge ring 25*a*.

Further, in the fourth and fifth modified examples, the inner edge ring 25*a* is an example of the second edge ring that is vertically movable. Each of the outer edge ring 25*b* and the innermost edge ring 25*c* is an example of the first edge ring that is fixed in proximity to the second edge ring. In other words, in the fourth and fifth modified examples, the first edge ring is composed of multiple parts.

As such, the first edge ring may be divided into multiple parts. When the first edge ring is divided into multiple parts, the side surface of the second edge ring and at least one of the multiple parts of the first edge ring may at least partially face each other in the vertical movement range of the second edge ring.

Figure 4F:
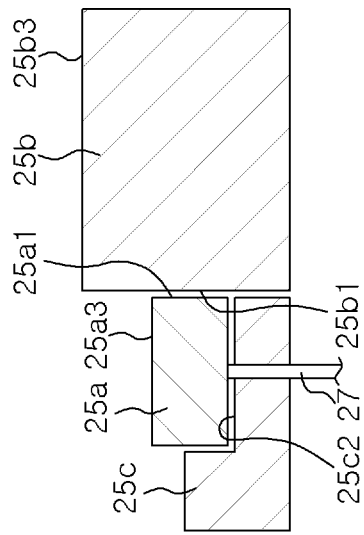

In a sixth modified example shown in FIG. 4F, the edge ring 25 according to the sixth modified example is divided into two edge rings, i.e., an inner edge ring 25*a* and an outer edge ring 25*b*. The inner edge ring 25*a* is disposed on an inner peripheral side of the outer edge ring 25*b*, and the intersection of an outer peripheral side surface 25*b*6 and a side surface 25*b*1 of the outer edge ring 25*b* is higher than a top surface 25*a*3 of the inner edge ring 25*a*. The difference from the present embodiment shown in FIG. 2B is that the outer peripheral surface 25*b*6 of the outer edge ring 25*b* is not perpendicular to the top surface 25*b*2 but is rounded.

In the sixth modified example, the inner edge ring 25*a* is an example of the second edge ring that is vertically movable, and the outer edge ring 25*b* is the first edge ring that is fixed in proximity to the second edge ring. In the edge ring 25 according to the sixth modified example, a side surface 25*a*1 of the inner edge ring 25*a* and the side surface 25*b*1 of the outer edge ring 25*b* at least partially face each other in the vertical movement range of the inner edge ring 25*a*.

When the second edge ring to be driven to move up and down is disposed on the substrate side, the second edge ring can be moved up and down in the vicinity of the substrate. The controllability for the edge region of the substrate can be improved. Even when the fixed first edge ring is disposed on the substrate side, the edge ring 25 is configured such that the side surface of the first edge ring and the side surface of the second edge ring at least partially face each other within the vertical movement range of the second edge ring. As a result, the controllability for the edge region of the substrate can be improved, and desired processing characteristics can be obtained even in the edge region of the substrate.

Further, by dividing the edge ring into the first edge ring and the second edge ring, only a part of the edge ring, e.g., the consumed edge ring needs to be replaced, which leads to cost reduction. In particular, since the consumption of the edge ring disposed on the side closer to the substrate among the divided edge rings has a large effect on the processing characteristics of the edge region of the substrate, it is advantageous to replace only the edge ring disposed on the side closer to the substrate.

<Substrate Processing Method Including Moving Method of Edge Ring>

Figure 5:
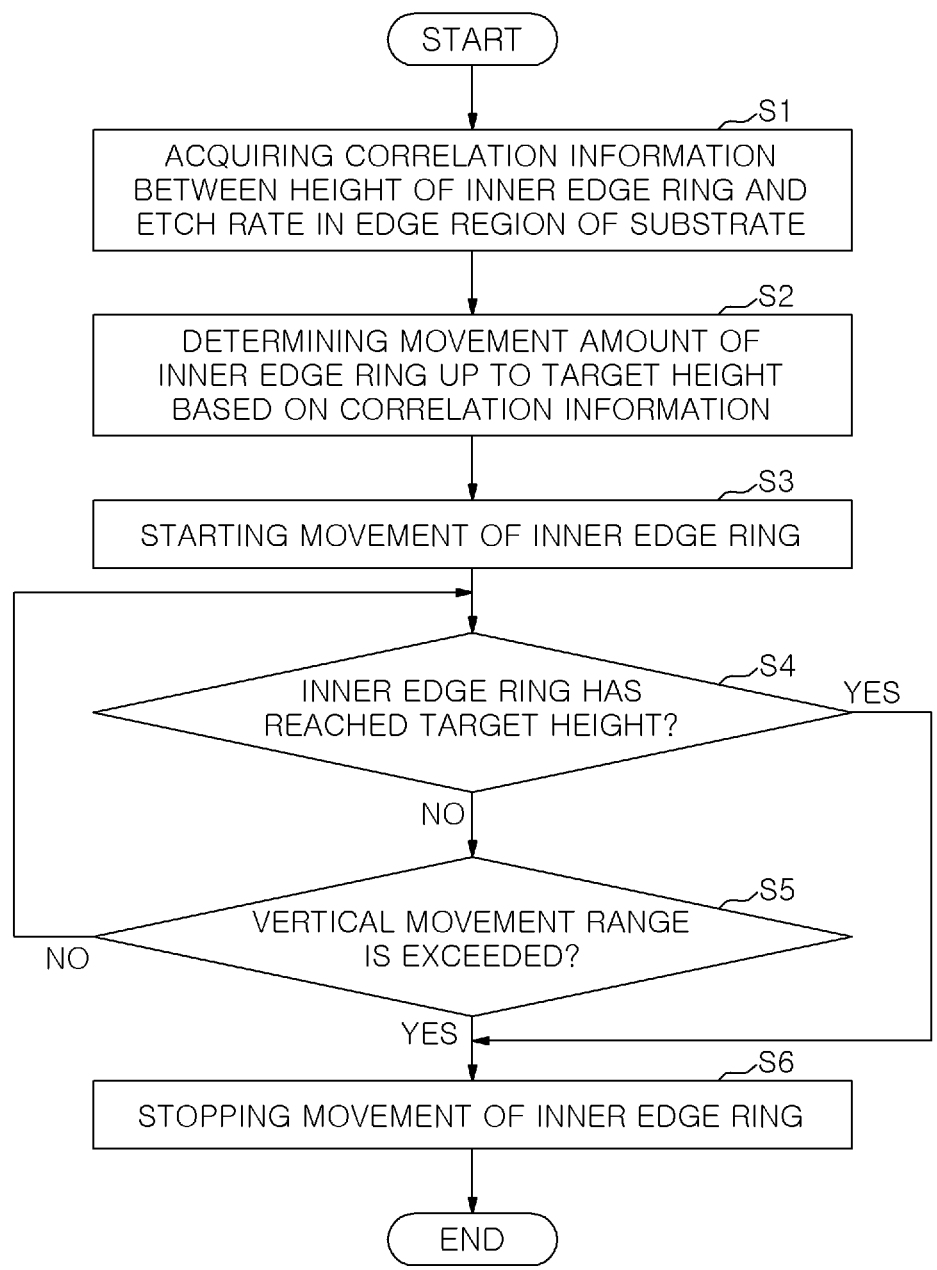
FIG. 5 is a flowchart showing an example of a substrate processing method including an edge ring moving method according to the embodiment.

Next, a substrate processing method including a method of moving the edge ring 25 according to the embodiment will be described with reference to FIG. 5. FIG. 5 is a flowchart showing an example of the substrate processing method including the method of moving the edge ring according to the embodiment. This process is controlled by the controller 80.

A start timing of the process may be set based on an amount of consumption of the edge ring 25, particularly, an amount of consumption of the inner edge ring 25*a* disposed to surround the substrate. Alternatively, the start timing of the process may be set based on an application time of the radio frequency power from the first radio frequency power supply 62 and/or the second radio frequency power supply 64. The start timing of the process may be set based on a measurement result of the processing characteristics (e.g., etch rate) of the edge region of the substrate. Further, the start timing of the process may be set to start the process whenever one substrate is processed, whenever a certain number of substrates are processed, whenever each lot is processed, or whenever a certain number of lots are processed.

When the process is started, the controller 80 acquires the correlation information between the height of the inner edge ring 25*a* measured in advance and the etch rate in the edge region (e.g., 148 mm) of the substrate (step S1). The correlation information indicates the height of the inner edge ring 25*a* to be controlled in response to the value of the etch rate. By vertically moving the inner edge ring 25*a* to allow the inner edge ring 25*a* to reach the height corresponding to the etch rate, the processing characteristics in the edge region of the substrate can be accurately controlled. Examples of the processing characteristics include the etch rate, an etching shape, and a critical dimension (CD) value.

Then, the controller 80 determines a movement amount of the inner edge ring 25*a* up to the target height that corresponds to a desired etch rate based on the acquired correlation information (step S2). Next, the controller 80 starts controlling the vertical movement of the inner edge ring 25*a* (step S3).

Thereafter, the controller 80 determines whether or not the inner edge ring 25*a* has reached the target height (step S4). When it is determined that the inner edge ring 25*a* has not reached the target height, the controller 80 determines whether or not the movement amount of the inner edge ring 25*a* exceeds the vertical movement range of the inner edge ring 25*a* (step S5). The determination of whether the vertical movement range of the inner edge ring 25*a* is exceeded or not is made based on an upper limit value of the vertical movement range of the inner edge ring 25*a*. The upper limit value of the vertical movement range of the inner edge ring 25*a* is set in advance to a value that satisfies the condition that the side surface of the inner edge ring 25*a* and the side surface of the outer edge ring 25*b* at least partially face each other. When the controller 80 determines that the movement amount of the inner edge ring 25*a* does not exceed the vertical movement range of the inner edge ring 25*a*, the process returns to step S4. Then, the controller 80 repeatedly executes steps S4 and S5 until it is determined that the inner edge ring 25*a* reaches the target height or the movement amount of the inner edge ring 25*a* exceeds the vertical movement range of the inner edge ring 25*a*.

When the controller 80 determines that the inner edge ring 25*a* has reached the target height or the movement amount of the inner edge ring 25*a* exceeds the vertical movement range of the inner edge ring 25*a*, the vertical movement of the inner edge ring 25*a* is stopped (step S6). Then, the process is terminated.

As described above, according to the edge ring, the substrate support, and the substrate processing apparatus and method of the present embodiment and the modified examples, the edge ring 25 is divided into the inner edge ring 25*a* and the outer edge ring 25*b*, and one of the divided edge rings is vertically moved. Since the side surface 25*a*1 of the inner edge ring 25*a* and the side surface 25*b*1 of the outer edge ring 25*b* at least partially face each other in the vertical movement range of the edge ring 25, the RF path can be ensured. Thus, the inner edge ring 25*a* and the outer edge ring 25*b* are electrically connected. Overall, by moving the edge ring configured to be movable in the vertical movement range, the control of the edge region of the substrate can be stably performed.

As described above, the present embodiment and the modified examples provide the edge ring that includes a plurality of members and is capable of suppressing variation in processing characteristics occurring when one member is vertically moved with respect to the other members. Further, it is possible to make it difficult for the resistance of the AC voltage transmitted from one of the divided members to the others to change with respect to the vertical movement of the divided edge ring.

The edge ring, the substrate support, and the substrate processing apparatus and method according to the presently disclosed embodiments are considered in all respects to be illustrative and not restrictive. The above-described embodiments can be embodied in various forms without departing from the scope of the appended claims and the gist thereof. Further, the contents described in the above embodiments can be implemented in other embodiments without contradicting each other and can be combined without contradicting each other.

For example, the substrate processing apparatus of the present disclosure may be applied to any type of apparatus using atomic layer deposition (ALD), capacitively coupled plasma (CCP), inductively coupled plasma (ICP), a radial line slot antenna (RLSA), electron cyclotron resonance plasma (ECR), or helicon wave plasma (HWP).

Although the plasma processing apparatus has been described as an example of the substrate processing apparatus, the substrate processing apparatus is not limited to the plasma processing apparatus and may be any apparatus that performs a predetermined process (for example, film forming process, etching process, and the like) on the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An edge ring comprising:
a first edge ring; and
a second edge ring that has a second side surface adjacent to a first side surface of the first edge ring and is movable in a vertical direction along the first side surface of the first edge ring,
wherein a length in a vertical direction of the first side surface is larger than a length in the vertical direction of the second side surface,
wherein the first side surface of the first edge ring and the second side surface of the second edge ring at least partially face each other in a movement range of the second edge ring,
wherein each of the first edge ring and the second edge ring is made of Si or SiC,
wherein the second side surface of the second edge ring is disposed inward from an outer peripheral side of the first edge ring, the first edge ring has a recess for receiving the second edge ring, and the recess is defined by the first side surface, a third side surface facing the first side surface and a bottom surface for mounting the second edge ring,
wherein the third side surface is radially inside an innermost periphery of the second edge ring, and wherein the third side surface is a closest adjacent upright surface of the first edge ring which faces the first side surface of the first edge ring, and
wherein the third side surface is immediately adjacent and faces the innermost periphery of the second edge ring at least in an unraised position, and
wherein a gap is provided between the first side surface of the first edge ring and the second side surface of the second edge ring, and the gap is sized so that an RF path extends from the first edge ring to the second edge ring across the gap.

2. The edge ring of claim 1, wherein the first edge ring and the second edge ring are electrically connectable.

3. The edge ring of claim 1, wherein the second edge ring is disposed on an inner peripheral side of the first edge ring.

4. The edge ring of claim 1, wherein the first edge ring is composed of multiple parts.

5. The edge ring of claim 1, wherein the first edge ring and the second edge ring are made of the same material.

6. A substrate support comprising:
a substrate supporting surface on which a substrate is placed;
an edge ring arranged to surround the substrate; and
a lift pin,
wherein the edge ring includes a first edge ring and a second edge ring that has a second side surface adjacent to a first side surface of the first edge ring and is movable in a vertical direction along the first side surface of the first edge ring,
wherein the lift pin is configured to move the second edge ring in the vertical direction in a range in which at least a part of the second side surface of the second edge ring faces the first side surface of the first edge ring,
wherein a length in a vertical direction of the first side surface is larger than a length in the vertical direction of the second side surface, wherein each of the first edge ring and the second edge ring is made of Si or SiC, and
wherein the second side surface of the second edge ring is disposed inward from an outer peripheral side of the first edge ring, the first edge ring has a recess for receiving the second edge ring, and the recess is defined by the first side surface, a third side surface facing the first side surface and a bottom surface for mounting the second edge ring,
wherein the third side surface is radially inside an innermost periphery of the second edge ring, and wherein the third side surface is a closest adjacent upright surface of the first edge ring which faces the first side surface of the first edge ring,
wherein the third side surface is immediately adjacent and faces the innermost periphery of the second edge ring at least in an unraised position, and
wherein a gap is provided between the first side surface of the first edge ring and the second side surface of the second edge ring, and the gap is sized so that an RF path extends from the first edge ring to the second edge ring across the gap.

7. The substrate support of claim 6, wherein the first edge ring and the second edge ring are electrically connectable.

8. A substrate processing apparatus comprising:
a chamber for processing a substrate; and
wherein the substrate support described in claim 6 that is disposed in the chamber.

9. The edge ring of claimer 1, wherein the first side surface comprises an inner peripheral side of the first edge ring, and
the second side surface comprises an outer peripheral side of the second edge ring.

10. The edge ring of claim 1, wherein the first edge ring and the second edge ring are electrically connected in a lowered position of the second edge ring.

11. The edge ring of claim 1, wherein a height of the third side surface is smaller than the height of the first side surface.

12. The edge ring of claim 1, wherein the recess has at least one through-hole, and
the second edge ring is movable in the vertical direction by a lift pin inserted into the at least one through-hole.

13. The edge ring of claim 1, wherein a height of the outer peripheral surface of the first edge ring is greater than a height of an inner peripheral surface of the first edge ring.

14. A substrate processing apparatus comprising:
   a chamber for processing a substrate;
   a substrate support disposed in the chamber; and
   the edge ring described in claim 1 that is arranged to surround the substrate.

15. A substrate processing apparatus comprising:
   a chamber for processing a substrate;
   a substrate support disposed in the chamber; and
   the edge ring described in claim 5 that is arranged to surround the substrate.

16. The edge ring of claim 11, wherein the height of the third side surface is smaller than a height of a top of the second edge ring in a non-raised position.

17. The substrate processing apparatus according to claim 14, further including a supporting part which supports the substrate support, and wherein an outer periphery of the edge ring is radially inside of an outer periphery of the supporting part.

* * * * *